(12) United States Patent
Hiratsuka

(10) Patent No.: US 8,206,608 B2
(45) Date of Patent: Jun. 26, 2012

(54) HIGHLY THERMAL CONDUCTIVE COMPOUND

(75) Inventor: Koji Hiratsuka, Satte (JP)

(73) Assignee: Cosmo Oil Lubricants Co., Ltd., Tokyo (JP)

( * ) Notice: Subject to any disclaimer, the term of this patent is extended or adjusted under 35 U.S.C. 154(b) by 0 days.

(21) Appl. No.: 12/595,279

(22) PCT Filed: Apr. 7, 2008

(86) PCT No.: PCT/JP2008/056903
§ 371 (c)(1),
(2), (4) Date: Oct. 9, 2009

(87) PCT Pub. No.: WO2008/126829
PCT Pub. Date: Oct. 23, 2008

(65) Prior Publication Data
US 2010/0065774 A1    Mar. 18, 2010

(30) Foreign Application Priority Data

Apr. 10, 2007  (JP) .................................. 2007-103294
Feb. 4, 2008   (JP) .................................. 2008-023955

(51) Int. Cl.
*C09K 3/00* (2006.01)
*C09K 5/00* (2006.01)
*C09K 5/04* (2006.01)

(52) U.S. Cl. ................ 252/76; 252/74; 252/73; 252/79; 252/512; 252/67; 524/437; 524/439; 428/323; 428/325; 428/327; 428/328

(58) Field of Classification Search ........... 252/74, 252/76, 73, 79, 512, 518.1, 519.2, 517.3; 524/437, 439; 428/323, 320.2, 325, 327, 428/328
See application file for complete search history.

(56) References Cited

U.S. PATENT DOCUMENTS

| | | | |
|---|---|---|---|
| 4,265,775 A * | 5/1981 | Aakalu et al. ............... 252/573 |
| 5,098,609 A * | 3/1992 | Iruvanti et al. ............. 252/511 |
| 5,167,851 A * | 12/1992 | Jamison et al. ............. 252/74 |
| 5,591,789 A * | 1/1997 | Iruvanti et al. ............. 523/515 |
| 5,827,331 A | 10/1998 | Block et al. |
| 6,372,337 B2 * | 4/2002 | Takahashi et al. ........... 428/328 |
| 6,515,061 B1 * | 2/2003 | Iruvanti et al. ............. 524/437 |
| 6,632,780 B2 * | 10/2003 | Uematsu et al. ............. 508/155 |
| 6,656,389 B2 * | 12/2003 | Iruvanti et al. ............. 252/500 |
| 7,312,185 B2 * | 12/2007 | Willey et al. ............... 508/165 |
| 2003/0004066 A1 * | 1/2003 | Iruvanti et al. ............. 505/100 |
| 2003/0008961 A1 * | 1/2003 | Uematsu ..................... 524/430 |
| 2004/0092408 A1 * | 5/2004 | Willey et al. ............... 508/165 |
| 2006/0292840 A1 * | 12/2006 | Lin et al. ................... 438/584 |
| 2007/0241303 A1 * | 10/2007 | Zhong et al. ............ 252/62.3 T |
| 2008/0311381 A1 * | 12/2008 | Kumar et al. ............... 428/323 |

FOREIGN PATENT DOCUMENTS

| JP | 2930298 B1 | 8/1999 |
| JP | 2938428 B1 | 8/1999 |
| JP | 2006-96973 A | 4/2006 |
| JP | 2006096973 A * | 4/2006 |
| JP | 2006-210437 A | 8/2006 |
| JP | 2006210437 A * | 8/2006 |

OTHER PUBLICATIONS

Derwent abstracts of JP 2006096973 A, Kimura et al., Apr. 2006.*
Derwent abstracts of JP 2006210437 A, Kimura et al., Aug. 2006.*
Machine translation of JP 2006096973 to Kimura et al. Apr. 2006.*
International Search Report for PCT/JP2008/056903 dated Jul. 1, 2008 [PCT/ISA/210].
Written Opinion PCT/JP2008/056903 [PCT/ISA/237].

* cited by examiner

*Primary Examiner* — Mark Eashoo
*Assistant Examiner* — Jane L Stanley
(74) *Attorney, Agent, or Firm* — Sughrue Mion, PLLC

(57) ABSTRACT

The present invention provides a highly thermal conductive compound which has a high thermal conductivity, has a high consistency and a good coating workableness, and is excellent in thermal stability at a high temperature. A highly thermal conductive compound containing (A) 85 to 97% by mass of an inorganic powder filler, (B) 2 to 15% by mass of a base oil, and (C) 0.001 to 10% by mass of a compound represented by Y—(—$R_2$—COO—)$_n$—$R_1$—X (wherein $R_1$ and $R_2$ each is a bivalent hydrocarbon group having a linear or branched chain having 1 to 36 carbon atoms, n is 1 to 15, X and Y each is at least one substituent selected from the group consisting of a carboxyl group and a hydroxyl group or a hydrogen atom, and at least one of X and Y is a carboxyl group or a hydroxyl group.

6 Claims, No Drawings

US 8,206,608 B2

HIGHLY THERMAL CONDUCTIVE COMPOUND

TECHNICAL FIELD

The present invention relates to a highly thermal conductive compound having an extremely high thermal conductivity and relates to a highly thermal conductive compound excellent in coating workableness and thermal stability in a high-temperature environment.

BACKGROUND ART

Among the semiconductor parts used in electronic devices, there are parts, such as CPU for computers and power semiconductors for power source control including inverters, converters, and the like, which generate heat during their use. In order to protect these semiconductor parts from the heat and to operate them normally, there is a method wherein the generated heat is conducted to heat-radiating parts such as a heat sink to radiate the heat. A thermal conductive compound is applied between these semiconductor parts and the heat-radiating parts so as to adhere them closely and is used so as to conduct the heat of these semiconductor parts to the heat-radiating parts efficiently. Recently, the performance of the electronic devices using these semiconductor parts has been improved and miniaturization and high-density mounting have been advanced, so that a higher thermal conductivity is required for the thermal conductive compound to be used for heat-radiation and it is also required for the compound to have a high consistency for a good coating workableness.

A thermal conductive compound is a grease-like composition wherein a filler having a high thermal conductivity, e.g., a metal oxide such as zinc oxide or aluminum oxide, an inorganic nitride such as boron nitride, silicon nitride, or aluminum nitride, a metal powder such as aluminum or copper, or the like, is dispersed in a base oil such as a liquid hydrocarbon, a silicone oil, or a fluorinated oil. For example, there are disclosed one wherein a specific thermal conductive inorganic filler is blended with a hydrocarbon oil and a fluorinated oil (Patent Document 1 etc.), one wherein aluminum nitride subjected to surface treatment with a specific organosilane is blended with a base oil such as a silicone oil (see Patent Document 2 etc.), one blended with a specific surface modifier (see Patent Documents 3, 4, etc.), and the like.

Patent Document 1: Japanese Patent No. 2938428
Patent Document 2: Japanese Patent No. 2930298
Patent Document 3: JP-A-2006-210437
Patent Document 4: JP-A-2006-96973

DISCLOSURE OF THE INVENTION

Problems that the Invention is to Solve

A thermal conductive compound is used at thermal contact interfaces in cooling devices for CPU and the like of computers and cooling devices for power semiconductors and the like used in high-output inverters. Recently, in the semiconductor elements in these electronic devices, heat-generation density and heat generation values are increased with the advance in miniaturization and performance, so that a higher thermal conductivity is required for the thermal conductive compound. In general, thermal conductivity of the thermal conductive compound increases with the increase in the amount of the filler but there is a case where consistency decreases and a sufficient coating workableness is not obtained when the amount of the filler is too large. In this case, there is a risk that thermal conductivity decreases when the film thickness of the coated film increases or bubbles are mixed in.

Therefore, a technology is required, wherein the filler can be incorporated in a large amount with maintaining a high consistency and a good coating workableness. Furthermore, since such a highly thermal conductive compound is used through its direct application to heat-generating parts, the consistency is sometimes changed under the influence of heat to a large extent depending on the kind of the thermal conductive compound. In the case where the consistency remarkably decreases during the actual use as a thermal interface material, cracks and the like may be generated and thus heat removing performance may decrease.

Accordingly, in the case of the use in an environment of a large heat generation value over a long period of time, it is required for the thermal conductive compound as its performance to have a high thermal conductivity and also an excellent thermal stability with a little change in consistency under a high temperature.

An object of the invention is to provide a highly thermal conductive compound which has a high thermal conductivity, has a high consistency and a good coating workableness, and is excellent in thermal stability at a high temperature.

Means for Solving the Problems

As a result of extensive studies for achieving the above object, the present inventors have found that the use of a specific surface modifier for improving the dispersibility of the inorganic powder filler results in a high consistency even when the inorganic powder filler is incorporated at a high packing ratio and also can improve thermal stability. Thus, they have accomplished the invention.

Namely, the invention provides a highly thermal conductive compound comprising (A) 85 to 97% by mass of an inorganic powder filler, (B) 2 to 15% by mass of a base oil, and (C) 0.001 to 10% by mass of a compound represented by formula (1).

[Chem 2]

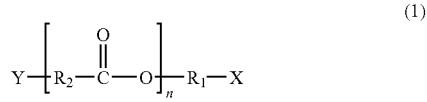

(1)

wherein $R_1$ and $R_2$ each is a bivalent hydrocarbon group having a linear or branched chain having 1 to 36 carbon atoms, n is 1 to 15, X and Y each is at least one substituent selected from the group consisting of a carboxyl group and a hydroxyl group or a hydrogen atom, and at least one of X and Y is a carboxyl group or a hydroxyl group; in the case where n is 2 to 15, the moiety of $(-R_2-COO-)_n$ in the formula (1) may be a copolymer group composed of two or more constitutional units $(-R_2-COO-)$ wherein $R_2$ is a bivalent hydrocarbon group different from one another.

Moreover, the invention provides the highly thermal conductive compound as described above, wherein the inorganic powder filler is at least one selected from the group consisting of metal oxide powders and metal powders.

Furthermore, the invention provides the highly thermal conductive compound, which contains (D) 0.01 to 4% by mass of an unsaturated fatty acid.

Advantage of the Invention

The highly thermal conductive compound of the invention has an increased filled amount of an inorganic filler by the action of a specific surface modifier and thus can realize a high thermal conductivity without impairing coating workableness as well as can improve heat resistance. The use of the highly thermal conductive compound of the invention can improve heat-radiating ability of electronic devices which generate intense heat and particularly, the compound is suitable as a thermal interface material for power semiconductors and LED.

BEST MODE FOR CARRYING OUT THE INVENTION (1) Inorganic Powder Filler

The inorganic powder filler (A) for use in the invention is not particularly limited so far as it has a thermal conductivity higher than the base oil and a powder of a metal oxide, an inorganic nitride, a metal, a silicon compound, a carbon material, or the like is suitably used. A single kind of the inorganic powder filler of the invention may be used or the filler may be used as a combination of two or more kinds thereof.

As the above inorganic powder filler, in the case where an electric insulating property is required, a powder of a non-electrically conductive substance such as a semiconductor or ceramic, including zinc oxide, aluminum oxide, boron nitride, silicon carbide, silica, diamond, or the like can be suitably used, a powder of zinc oxide, aluminum oxide, boron nitride, or silica being more preferred and a powder of zinc oxide or aluminum oxide being particularly preferred. These inorganic powder fillers may be used singly or as a combination of two or more kinds thereof. Moreover, in the case where an electrically insulating property is not required and a higher thermal conductivity is required, a powder of a metal such as metal aluminum or metal copper or a powder of a carbon material such as graphite, fullerene, or carbon nanotube can be suitably used, a metal powder being more preferred and a powder of metal aluminum being particularly preferred. Also, a powder of a metal or a powder of a carbon material may be used in combination with the above powder of a non-electrically conductive substance.

Moreover, as the above inorganic powder filler, in the case where fine particles alone are used, it is preferred to use an inorganic powder having an average particle diameter of 0.15 to 3 µm. By regulating the average particle diameter to 0.15 µm or more, a good balance of the ratio of surface area of the inorganic powder filler to the liquid components (base oil and surface modifier) is achieved and a higher consistency can be obtained. On the other hand, by regulating the average particle diameter to 3 µm or less, closest packing is apt to occur, a higher thermal conductivity is achieved, and oil separation hardly occurs. Moreover, in the case where fine particles are combined with coarse particles, the above fine particles can be combined with coarse inorganic powder having an average particle diameter of 5 to 50 µm. In this case, by regulating the average particle diameter of the coarse particles to 50 µm or less, the resultant coated film can be made thin and thus heat removing performance when mounted can be further enhanced. On the other hand, by regulating the average particle diameter of the coarse particles to 5 µm or more, a higher thermal conductivity can be easily obtained.

In the case where the inorganic powder filler is a combination of fine particles and coarse particles, the coarse particles may be a combination of two or more kinds of powders different in average particle diameter. Also in this case, from the viewpoints of thermal conductivity and heat removing performance when mounted, the average particle diameter of each of the coarse particles is preferably 5 to 50 µm.

Moreover, in the case where fine and coarse inorganic powder fillers are combined, they are preferably mixed in a mass ratio of the range of 20:80 to 85:15. In the case where two or more kinds of coarse particles are combined, the mass ratio of the coarse particles themselves is not particularly limited but the mass ratio of the fine particles is preferably in the range of 20% to 85% of the inorganic powder fillers. By regulating the mixing ratio of the fine particles to the coarse particles to the above range, a high consistency can be obtained based on the balance of the surface area of the inorganic powder fillers to the amount of the liquid components (base oil and surface modifier). Moreover, the balance between the coarse particles and the fine particles is suitable for closest packing and thus oil separation hardly occurs.

The content of the inorganic powder filler is 85 to 97% by mass but is preferably 90 to 96% by mass since thermal conductivity becomes excellent with the increase in the content. When the content is less than 85% by mass, thermal conductivity decreases and/or oil separation occurs to result in exudation of the base oil in some cases. On the other hand, when the content exceeds 97% by mass, the consistency decreases and a sufficient coating workableness is not maintained or the thermal conductive compound cannot be prepared.

(2) Base Oil

As the base oil (B), various base oils can be used. For example, there may be mentioned hydrocarbon-based base oils such as mineral oils and synthetic hydrocarbon oils, ester-based base oils, ether-based base oils, phosphate esters, silicone oils, fluorinated oils, and the like, and preferred are hydrocarbon-based base oils, ester-based base oils, and polyether base oils. In view of preventing the separation of the base oil, silicone oils and fluorinated oils having a low surface tension are not so preferred. The base oils may be used singly or as a combination of two or more kinds thereof.

The mineral oils may be those obtained by purifying a lubricant fraction which is to be a mineral oil through suitable combination of purification methods such as solvent extraction, solvent dewaxing, purification by hydrogenation, hydrogenolysis, and wax isomerization, and there may be mentioned 150 neutral oil, 500 neutral oil, bright stock, a high-viscosity-index base oil, and the like. The mineral oil is preferably a high-viscosity-index base oil highly purified by hydrogenation.

As the synthetic hydrocarbon oils, there may be, for example, mentioned those obtained by mixing and polymerizing one or two or more of α-olefins produced using ethylene, propylene, butene, and/or derivatives thereof as starting material(s). As the α-olefins, there may be preferably mentioned those each having 6 to 14 carbon atoms.

Specifically, there may be mentioned poly-α-olefins (PAO) which are oligomers of 1-decene, polybutenes which are oligomers of 1-butene or isobutylene, cooligomers of ethylene with an α-olefin, and the like. Moreover, alkylbenzenes, alkylnaphthalens, and the like can be also used.

As the ester-based base oils, diesters and polyol esters may be mentioned.

As the diesters, there may be mentioned esters of dibasic acids such as adipic acid, azelaic acid, sebacic acid, and dodecanedioic acid. As the dibasic acids, aliphatic dibasic acids each having 4 to 36 carbon atoms are preferred. As alcohol residues constituting the ester moieties, monohydric alcohol residues each having 4 to 26 carbon atoms are preferred.

As the polyol esters, there may be mentioned esters of neopentyl polyols where no hydrogen atom is present on the carbon at the β-position, specifically carboxylic acid esters of neopentyl glycol, trimethylolpropane, pentaerythritol, and the like. The carboxylic acid residues constituting the ester moieties are preferably monocarboxylic acid residues each having 4 to 26 carbon atoms.

Moreover, other than the above, there may be mentioned esters of aliphatic dihydric alcohols such as ethylene glycol, propylene glycol, butylene glycol, 2-butyl-2-ethylpropanediol, and 2,4-diethyl-pentanediol with linear or branched saturated fatty acids. As the linear or branched saturated fatty acids, monovalent linear or branched saturated fatty acids each having 4 to 30 carbon atoms are preferred.

As the ether-based base oils, polyglycols, phenyl ethers, and the like may be mentioned.

As the polyglycols, there may be mentioned polyethylene glycol, polypropylene glycol, derivatives thereof, and the like.

As the phenyl ethers, there may be mentioned alkylated diphenyl ether, (alkylated) polyphenyl ethers, and the like.

As the phosphate esters, there may be mentioned triethyl phosphate, tributyl phosphate, triphenyl phosphate, tricresyl phosphate, trixylenyl phosphate, and the like.

The thermal conductive compound is applied to a heat-generating part and hence is exposed to a high temperature for a long time. Therefore, the base oil is desirably excellent in thermal oxidation stability. Among the above base oils, synthetic base oils are preferred and synthetic hydrocarbon oils, ester-based base oils, and ether-based base oils are preferred. Among these base oils, as those particularly excellent in thermal oxidation stability, poly-α-olefins among the synthetic hydrocarbon oils, polyol esters among the ester-based base oils, and phenyl ethers among the ether-based base oils are used as preferred base oils. Furthermore, among these base oils, poly-α-olefins having a high viscosity index and polyol esters having a high solubility of additives are used as particularly preferred base oils.

The kinematic viscosity of the base oil is preferably 10 mm$^2$/s to 600 mm$^2$/s at 40° C. By regulating the kinematic viscosity at 40° C. to 10 mm$^2$/s or more, evaporation of the base oil at a high temperature and oil separation are tend to be suppressed and hence the case is preferred. Also, by regulating the kinematic viscosity at 40° C. to 600 mm$^2$/s or less, a high consistency is easily obtained and hence the case is preferred.

The content of the base oil is 2 to 15% by mass, preferably 2.5 to 12% by mass, and particularly preferably 3 to 10% by mass. When the content exceeds 15% by mass, the consistency is too high and the thermal conductive compound flows out in some cases. Furthermore, oil separation occurs and thermal conductivity decreases in some cases.

(3) Compound (C)

The compound (C) for use in the invention is a compound represented by the formula (1), which is adsorbed on the surface of the inorganic powder filler and has at the same time a function as a surface modifier which enhances affinity to the base oil and a function as a dispersing agent which prevents aggregation of the filler itself by steric hindrance.

The compound (C) for use in the invention can achieve a high consistency and improve coating workableness as compared with the surface modifiers conventionally used. Also, a high packing ratio of the filler is enabled and hence a higher thermal conductivity can be obtained.

Furthermore, since the compound (C) for use in the invention has a high thermal-resisting property when compared with the surface modifier conventionally used, thermal-resisting property of the highly thermal conductive compound can be improved by the use of the compound (C) as a surface modifier and a dispersing agent.

In the formula (1), $R_1$ and $R_2$ each is a bivalent hydrocarbon group having a linear or branched chain having 1 to 36 carbon atoms and may be the same or different from each other. As the bivalent hydrocarbon group, there may be mentioned an alkylene group, an alkenylene group, an arylene group, and the like and an alkylene group is preferred. Moreover, the number of carbon atoms in the bivalent hydrocarbon group is 1 to 36, preferably 2 to 32, and more preferably 8 to 30. Also, the bivalent hydrocarbon group preferably has branch(es) and more preferably has one branching point. When the number of carbon atoms in the whole bivalent hydrocarbon group is larger than 36, the viscosity becomes too high and thus the thermal conductive compound cannot be prepared or becomes hard in some cases.

Moreover, in the case where n is 2 to 15, the moiety of $(-R_2-COO-)_n$ in the formula (1) may be a copolymer group composed of two or more constitutional units $(-R_2-COO-)$ wherein $R_2$ is a bivalent hydrocarbon group different from one another. The copolymer group may be a random structure or a block structure.

Furthermore, the weight-average molecular weight of the compound (C) is preferably about 400 to 10,000.

In the formula (1), n is 1 to 15, more preferably 2 to 10. When n is larger than 15, the viscosity becomes too high and thus the thermal conductive compound cannot be prepared or becomes hard in some cases.

In the formula (1), X and Y each is at least one substituent selected from the group consisting of a carboxyl group and a hydroxyl group or a hydrogen atom, and at least one of X and Y is a carboxyl group or a hydroxyl group. The combination of X and Y is preferably a combination of a carboxyl group and a hydroxyl group. Moreover, a combination where X is a carboxyl group and Y is a hydroxyl group is most preferred.

The compound (C) can be obtained, for example, by polymerizing a hydroxycarboxylic acid having 2 to 37 carbon atoms. Such a hydroxycarboxylic acid is not particularly limited so far as one having a structure described in the above formula (1) is obtained and, for example, there may be mentioned 3-hydroxylauric acid, 3-hydroxypalmitic acid, 3-hydroxystearic acid, 3-hydroxyarachidic acid, 8-hydroxypalmitic acid, 12-hydroxystearic acid, 12-hydroxylauric acid, 12-hydroxypalmitoleic acid, 12-hydroxyoleic acid, 16-hydroxypalmitic acid, and the like. Moreover, one wherein Y is a carboxyl group and one wherein X is a hydroxyl group can be obtained by linking a dicarboxylic acid having 2 to 36 carbon atoms and a dihydric alcohol having 1 to 36 carbon atoms, respectively, to a polymer of the above hydroxycarboxylic acid through an ester linkage.

The compound (C) for use in the invention is preferably contained in an amount of 0.001 to 10% by mass. The amount is more preferably 0.005 to 5% by mass, further preferably 0.01 to 4% by mass, and most preferably 0.01 to 1% by mass. In the case where the content is less than 0.001% by mass, not only a high consistency and a good thermal-resisting property are not obtained but also a packing ratio cannot be made high, so that a high thermal conductivity is not obtained. On the other hand, even when the content is more than 10% by mass, improvement of the advantage cannot be expected.

(4) Unsaturated Fatty Acid

In the invention, by further blending an unsaturated fatty acid (D), the humidity resistance of the thermal conductive compound can be improved. When the unsaturated fatty acid is blended, consistency change and hardening when the compound is placed under a high humidity environment can be prevented and thus decrease in heat removing performance can be prevented.

As the kind of the unsaturated fatty acid, the number of carbon atoms is preferably 8 to 30, particularly 12 to 26, and most preferably 16 to 24. By regulating the number of carbon atoms to this range, a high consistency and a good humidity resistance can be obtained. With regard to the unsaturated fatty acid, an unsaturated group is preferably a carbon-carbon double bond. The number of the carbon-carbon double bond is more preferably one to two bonds, particularly preferably one bond. One having more than two carbon-carbon double bonds possibly has decreased thermal-resisting property. The unsaturated fatty acid is preferably a monovalent or bivalent unsaturated fatty acid, more preferably monovalent unsaturated fatty acid with regard to the carboxyl group and is preferably an unsaturated fatty acid having a linear or branched chain of 8 or more carbon atoms with regard to the hydrocarbon group.

As specific examples of the unsaturated fatty acid, there may be, for example, mentioned caproleic acid, undecylenic acid, linderic acid, tsuzuic acid, myristoleic acid, palmitoleic acid, zoomaric acid, petroselinic acid, oleic acid, elaidic acid, pasenic acid, codoic acid, gondoic acid, cetoleic acid, erucic acid, brassidic acid, selacholeic acid, and the like.

These unsaturated fatty acids may be used singly or may be used as a combination of two or more kinds thereof. The unsaturated fatty acid for use in the invention is preferably contained in an amount of 0.001 to 5.0% by mass. The amount is more preferably 0.01 to 4.0% by mass, further preferably 0.05 to 3.0% by mass, and most preferably 0.05 to 1.0% by mass. By regulating the content to 0.001% by mass or more and 5.0% by mass or less, consistency change under a high humidity environment can be more effectively suppressed.

In the case where the compound (C) and the unsaturated fatty acid (D) are combined, the mass ratio is preferably 50:1 to 1:50. Moreover, in the case where higher consistency is desired, the ratio is preferably 25:1 to 1:10 and in the case where improvement in humidity resistance is desired, the ratio is preferably 10:1 to 1:25.

(5) Other Additives

Into the highly thermal conductive compound of the invention, the other known additives may be suitably blended, if necessary. As the additives, there may be, for example, mentioned phenolic, amine-based, sulfur/phosphorus-based, and the like compounds as antioxidants; compounds such as sulfonates, carboxylic acids, and carboxylates as rust inhibitors; compounds such as benzotriazole and its derivatives and thiadiazole-based compounds as corrosion inhibitors; and polybutene, polymethacrylate, fatty acid salts, urea compounds, petroleum waxes, polyethylene waxes, and the like as viscosity improvers and thickeners. The blending amount of each of these additives may be an ordinary amount.

(6) Production Method

With regard to the production of the highly thermal conductive compound of the invention, the method is not particularly limited so far as it can homogeneously mix the components. As a general production method, there may be mentioned a method of kneading them by means of a mortar, a planetary mixer, a twin-screw extruder, or the like to form a grease-like substance and subsequently kneading it by means of a three roll mill.

(7) Property of Compound

The highly thermal conductive compound of the invention can be used when its consistency is 200 or more but the consistency is preferably 250 to 400 from the viewpoints of coating workableness, spreading ability, adhesion property, oil-separation prevention, and the like.

EXAMPLES

The following will describe the invention in detail with reference to Examples but the invention is not limited thereto.

The following will show individual components used in Examples and Comparative Examples.

(1) Inorganic Powder Filler
  Zinc oxide 1: average particle diameter 0.6 μm
  Zinc oxide 2: average particle diameter 11 μm
  Alumina: average particle diameter 8 μm
  Metal aluminum: average particle diameter 33 μm (2) Base Oil
  PAO: poly-α-olefins (1-decene-oligomers), wherein 40° C. kinematic viscosity is 47 $mm^2/s$.
  POE: ester of pentaerythritol with monocarboxylic acids each having 8 to 10 carbon atoms, wherein 40° C. kinematic viscosity is 32 $mm^2/s$.
  DPhE: dialkylated diphenyl ether (those having alkyl groups each having a branched chain of 12 to 14 carbon atoms), wherein 40° C. kinematic viscosity is 98 $mm^2/s$.

(3) Additives
(i) Compound (C)
  (C-1): oligomers obtained by polymerizing 3 to 5 molecules of 12-hydroxystearic acid. Namely, in the formula (1), $R_1$ and $R_2$ are both alkylene groups each having 17 carbon atoms, n is 2 to 4, X is a carboxyl group, and Y is a hydroxyl group. Moreover, the weight-average molecular weight Mw (GPC in terms of polystyrene) is about 2,400.
  (C-2): oligomers obtained by polymerizing 5 to 8 molecules of 12-hydroxystearic acid. Namely, in the formula (1), $R_1$ and $R_2$ are both alkylene groups each having 17 carbon atoms, n is 4 to 7, X is a carboxyl group, and Y is a hydroxyl group. Moreover, the weight-average molecular weight Mw (GPC in terms of polystyrene) is about 5,450.
(ii) (Poly)glyceryl Ether (Surface Modifier)
  A small amount of polyglycerin monooleyl ether is contained in monoglycerin monooleyl ether.
(iii) Polybutenylsuccinimide (Dispersant)
  It contains a polybutenyl group having a molecular weight of 2,100.
(iv) Erucic Acid (Unsaturated Fatty Acid Having 22 Carbon Atoms)
(v) Oleic Acid (Unsaturated Fatty Acid Having 18 Carbon Atoms)
(vi) Amine-Based Antioxidant (Dialkylated Diphenylamine)

Examples 1 to 17

The following Tables 1, 2, and 3 show compositions of Examples 1 to 17 and performance and properties of the thermal conductive compounds. The components of the compositions shown in Tables 1, 2, and 3 were blended and the thermal conductive compounds were prepared by the following method. In this connection, the unit of the numerals of the compositions in the Tables 1, 2, and 3 is % by mass and the numerals in parenthesis for the inorganic powder fillers show average particle diameters.

Preparation of Thermal Conductive Compounds

Various additives such as a surface modifier and an antioxidant were dissolved in a base oil and then placed in a planetary mixer together with inorganic powder fillers. The whole was kneaded at room temperature to 60° C. for 30 minutes and well mixed to form a grease-like substance. Thereafter, kneading by means of a three roll mill was carried out 1 to 3 times to prepare a thermal conductive compound.

Using the resultant thermal conductive compounds, performance shown in the following was evaluated. With regard to the consistency, unworked penetration was measured in accordance with JIS-K2220. The larger the value of the consistency is, the softer the thermal conductive compound is and contrarily, the smaller the harder. The thermal conductivity was measured at room temperature by means of a quick thermal conductivity meter QTM-500 manufactured by Kyoto Electronics Manufacturing Co., Ltd. With regard to the standing test at a high temperature, 0.25 ml of the thermal conductive compound was held between iron plates to form a thin film having a thickness of 200 μm, the film was heated at 150° C. for 500 hours, and the consistency before and after the test was simply measured. With regard to the constant-temperature constant-humidity test, the thermal conductive compound was allowed to stand under the environment of a temperature of 60° and a relative humidity of 90% for 72 hours and the unworked penetration before and after the test was measured.

The results of the standing test at a high temperature and the constant-temperature constant-humidity test described in each table were shown by consistency change and unworked penetration change. In the case where the consistency decreased, that is, the compound became hard, the change was shown by a negative value, while in the case where the consistency increased, that is, the compound became soft, the change was shown by a positive value.

TABLE 1

|  | Example 1 | Example 2 |
|---|---|---|
| Inorganic powder filler | | |
| Zinc oxide 1 (0.6 μm) | 46.5 | 38.00 |
| Zinc oxide 2 (11 μm) | 23.25 | 57.00 |
| Metal aluminum (33 μm) | 23.25 | 0 |
| Total (% by mass) | 93.00 | 95.00 |
| Base oil | | |
| PAO | 5.00 | 3.53 |
| POE | 1.65 | 1.18 |
| Additive | | |
| Compound (C-1) | 0.14 | 0.14 |
| Amine-based antioxidant | 0.21 | 0.15 |
| Thermal conductivity [W/m · k] | 5.1 | 4.5 |
| Unworked penetration | 300 | 290 |
| Consistency change after 500 h of standing test at high temperature [%] | −5.4 | −14.3 |

TABLE 2

|  | Example 3 | Example 4 | Example 5 | Example 6 | Example 7 | Example 8 | Example 9 |
|---|---|---|---|---|---|---|---|
| Inorganic powder filler | | | | | | | |
| Zinc oxide 1 (0.6 μm) | 37.20 | 41.85 | 37.40 | 37.80 | 37.40 | 37.60 | 37.80 |
| Zinc oxide 2 (11 μm) | 32.55 | 27.90 | 42.08 | 37.80 | 42.08 | 37.60 | 37.80 |
| Metal aluminum (33 μm) | 23.25 | 23.25 | 14.03 | 18.90 | 14.03 | 18.80 | 18.90 |
| Total (% by mass) | 93.00 | 93.00 | 93.51 | 94.50 | 93.51 | 94.00 | 94.50 |
| Base oil | | | | | | | |
| PAO | 5.00 | 5.00 | 4.62 | 3.90 | 4.62 | 4.26 | 3.90 |
| POE | 1.65 | 1.65 | 1.54 | 1.30 | 1.54 | 1.42 | 1.30 |
| Additive | | | | | | | |
| Compound (C-1) | 0.015 | 0.02 | 0.015 | 0.015 | 0.015 | 0.015 | 0.015 |
| Erucic acid (unsaturated fatty acid) | 0.124 | 0.12 | 0.125 | 0.127 | 0.125 | 0.125 | 0.125 |
| Amine-based antioxidant | 0.21 | 0.21 | 0.20 | 0.17 | 0.20 | 0.18 | 0.17 |
| Thermal conductivity [W/m · k] | 5.1 | 4.9 | 5.1 | 5.6 | 5.4 | 5.4 | 5.6 |
| Unworked penetration | 315 | 305 | 295 | 270 | 305 | 285 | 275 |
| Consistency change after 500 h of standing test at high temperature [%] | −14.8 | −13.6 | −8.8 | −11.5 | −11.9 | −12.7 | −9.4 |
| Consistency change after 72 h of test at constant temperature and constant humidity [%] | −1.6 | 0.0 | 0.0 | 0.0 | −1.7 | 0.0 | 0.0 |

TABLE 3

|  | Example 10 | Example 11 | Example 12 | Example 13 | Example 14 | Example 15 | Example 16 | Example 17 |
|---|---|---|---|---|---|---|---|---|
| Inorganic powder filler | | | | | | | | |
| Zinc oxide 1 (0.6 μm) | 38.32 | 38.32 | 38.20 | 38.20 | 37.20 | 37.20 | 37.00 | 38.08 |
| Zinc oxide 2 (11 μm) | 57.48 | 57.48 | 57.30 | 57.30 | 32.55 | 32.55 | 32.38 | 57.12 |
| Metal aluminum (33 μm) | — | — | — | — | 23.25 | 23.25 | 23.12 | — |
| Total (% by mass) | 95.80 | 95.80 | 95.50 | 95.50 | 93.00 | 93.00 | 92.50 | 95.20 |

TABLE 3-continued

|  | Example 10 | Example 11 | Example 12 | Example 13 | Example 14 | Example 15 | Example 16 | Example 17 |
| --- | --- | --- | --- | --- | --- | --- | --- | --- |
| Base oil | | | | | | | | |
| PAO | 2.95 | 2.95 | 3.16 | 3.16 | 4.20 | 4.73 | 5.36 | 2.88 |
| POE | 0.98 | 0.98 | 1.06 | 1.06 | 1.40 | 1.57 | 1.78 | 0.96 |
| DPhE | — | — | — | — | 1.06 | 0.36 | — | 0.67 |
| Additive | | | | | | | | |
| Compound (C-1) | 0.009 | 0.013 | 0.014 | 0.019 | 0.014 | 0.014 | — | 0.010 |
| Compound (C-2) | — | — | — | — | — | — | 0.015 | — |
| Erucic acid (unsaturated fatty acid) | 0.135 | 0.13 | 0.13 | 0.125 | 0.119 | 0.119 | 0.120 | 0.134 |
| Amine-based antioxidant | 0.126 | 0.127 | 0.136 | 0.136 | 0.207 | 0.207 | 0.225 | 0.146 |
| Thermal conductivity [W/m · k] | 5.2 | 5.2 | 5.0 | 5.0 | 5.1 | 5.1 | 4.6 | 4.7 |
| Unworked penetration | 268 | 273 | 285 | 288 | 294 | 296 | 298 | 268 |
| Consistency change after 500 h of standing test at high temperature [%] | −10.0 | −13.5 | −12.1 | −9.1 | −3.4 | −14.8 | −13.1 | −7.3 |
| Consistency change after 72 h of test at constant temperature and constant humidity [%] | 0.0 | 0.0 | −0.7 | −1.8 | 3.4 | 1.6 | 0.0 | 3.6 |

Comparative Examples 1 to 6

The following Table 4 shows compositions of Comparative Examples 1 to 6 and performance and properties of the thermal conductive compounds. The components of the compositions shown in Table 4 were blended and the thermal conductive compounds were prepared in the same manner as in Examples.

TABLE 4

|  | Comparative Example 1 | Comparative Example 2 | Comparative Example 3 | Comparative Example 4 | Comparative Example 5 | Comparative Example 6 |
| --- | --- | --- | --- | --- | --- | --- |
| Inorganic powder filler | | | | | | |
| Zinc oxide 1 (0.6 μm) | 38.0 | 38.0 | 32.20 | 32.55 | 38.00 | 46.50 |
| Zinc oxide 2 (11 μm) | 57.00 | — | 59.80 | 60.45 | — | 23.25 |
| Metal aluminum (33 μm) | — | — | — | — | — | 23.25 |
| Alumina (8 μm) | — | 57.00 | — | — | 57.00 | — |
| Total (% by mass) | 95.00 | 95.00 | 92.00 | 93.00 | 95.00 | 93.00 |
| Base oil | | | | | | |
| PAO | 3.53 | 3.53 | 5.72 | 5.00 | 3.53 | 5.00 |
| POE | 1.18 | 1.18 | 1.90 | 1.65 | 1.18 | 1.65 |
| Additive | | | | | | |
| (Poly)glyceryl ether | 0.14 | — | — | — | 0.09 | — |
| Polybutenylsuccinimide | — | — | 0.01 | 0.01 | 0.05 | 0.01 |
| Oleic acid (unsaturated fatty acid) | — | 0.14 | 0.13 | — | — | 0.13 |
| Erucic acid (unsaturated fatty acid) | — | — | — | 0.13 | — | — |
| Amine-based antioxidant | 0.15 | 0.15 | 0.24 | 0.21 | 0.15 | 0.21 |
| Thermal conductivity [W/m · k] | 4.5 | 3.1 | 2.7 | 3.0 | 3.1 | 5.1 |
| Unworked penetration | 280 | 265 | 320 | 330 | 370 | 240 |
| Consistency change after 500 h of standing test at high temperature [%] | −28.6 | −3.8 | −6.25 | −3.03 | −29.7 | −26.92 |
| Consistency change after 72 h of test at constant temperature and constant humidity [%] | −1.8 | −2.0 | −6.25 | −10.6 | impossible to measure due to hardening | −9.6 |

As shown in Table 1, it is realized that Examples 1 and 2 containing the compound (C) have a high consistency and are excellent in coating workableness with high thermal conductivity of 4.5 W/m·K or more. Moreover, as shown in Table 2 and Table 3, it is realized that Examples 3 to 17 containing the compound (C) and an unsaturated fatty acid, erucic acid (unsaturated fatty acid having 22 carbon atoms containing one carbon-carbon double bond), have a high thermal conductivity of 4.5 W/m·K or more and a high consistency, further shows small consistency change even after the standing test at a high temperature and the constant-temperature constant-humidity test, and thus possess both of good thermal-resisting property and a good humidity resistance. On the other hand, Comparative Example 1 wherein (poly)glyceryl ether also having an effect as a surface modifier is blended instead of the compound (C) has good thermal conductivity and consistency but thermal-resisting property is poor. Also, Comparative Example 2 wherein only oleic acid also having an action as a surface modifier is contained has good thermal-resisting property and humidity resistance but thermal conductivity is low and consistency is also low. Comparative Example 3 wherein oleic acid and polybutenylsuccinimide having an action as a dispersant like the compound (C) are combined has a good thermal-resisting property and consistency is high but thermal conductivity remarkably decreases and humidity resistance is also poor. Comparative Example 4 wherein erucic acid and polybutenylsuccinimide are combined instead of oleic acid also has a low thermal conductivity and humidity resistance is also poor. On the other hand, Comparative Example 5 wherein (poly)glyceryl ether and polybutenylsuccinimide are combined has a low thermal conductivity, and thermal-resisting property is poor and humidity resistance is remarkably poor. Furthermore, Comparative Example 6 wherein oleic acid and polybutenylsuccinimide are combined and aluminum powder was contained to enhance thermal conductivity has a low consistency and thermal-resisting property is also poor.

While the invention has been described in detail and with reference to specific embodiments thereof, it will be apparent to one skilled in the art that various changes and modifications can be made therein without departing from the spirit and scope thereof.

The present application is based on Japanese Patent Application No. 2007-103294 filed on Apr. 10, 2007 and Japanese Patent Application No. 2008-023955 filed on Feb. 4, 2008, and the contents are incorporated herein by reference.

INDUSTRIAL APPLICABILITY

The highly thermal conductive compound of the present invention can improve heat-radiating ability of electronic devices which require measures against heat, and particularly, is suitable as a thermal interface material for CPU and power semiconductors.

The invention claimed is:

1. A highly thermal conductive compound comprising:
(A) 85 to 97% by mass of an inorganic powder filler,
(B) 2 to 15% by mass of a base oil comprising a polyol ester,
(C) 0.001 to 0.14% by mass of a compound represented by formula (1), and
(D) 0.05 to 1% by mass of erucic acid:

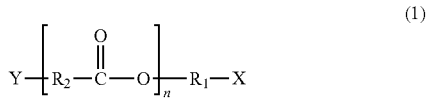

wherein $R_1$ and $R_2$ each is a bivalent hydrocarbon group having a linear or branched chain having 1 to 36 carbon atoms, n is 1 to 15, X and Y each is at least one substituent selected from the group consisting of a carboxyl group, a hydroxyl group and a hydrogen atom, and at least one of X and Y is a carboxyl group or a hydroxyl group; in the case where n is 2 to 15, the moiety of $(-R_2-COO-)_n$ in the formula (1) may be a copolymer group composed of two or more constitutional units $(-R_2-COO-)$ wherein $R_2$ is a bivalent hydrocarbon group different from one another, wherein a consistency of the highly thermal conductive compound is 250 to 400.

2. The highly thermal conductive compound according to claim 1, wherein the inorganic powder filler is at least one selected from the group consisting of a metal oxide powder and a metal powder.

3. The highly thermal conductive compound according to claim 1 or 2, further comprising 0.01 to 4% by mass of an unsaturated fatty acid other than erucic acid.

4. The highly thermal conductive compound according to claim 1, wherein the base oil comprises the polyol ester in an amount of 0.96% to 1.65% by mass.

5. The highly thermal conductive compound according to claim 1, wherein X and Y are a combination of a carboxyl group and a hydroxyl group.

6. The highly thermal conductive compound according to claim 1, wherein X is a carboxyl group and Y is a hydroxyl group.

* * * * *